(12) United States Patent
Hao et al.

(10) Patent No.: US 10,699,763 B2
(45) Date of Patent: Jun. 30, 2020

(54) MERGED WRITE DRIVER BASED ON LOCAL SOURCE LINE MRAM ARCHITECTURE

(71) Applicant: MARVELL INTERNATIONAL LTD., Hamilton (BM)

(72) Inventors: Wuyang Hao, San Jose, CA (US); Jack T. Wong, Fremont, CA (US); Chunsung Chiang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 34 days.

(21) Appl. No.: 15/983,263

(22) Filed: May 18, 2018

(65) Prior Publication Data

US 2019/0355402 A1  Nov. 21, 2019

(51) Int. Cl.
*G11C 11/00* (2006.01)
*G11C 11/16* (2006.01)

(52) U.S. Cl.
CPC ...... *G11C 11/1675* (2013.01); *G11C 11/1655* (2013.01); *G11C 11/1657* (2013.01); *G11C 11/1673* (2013.01)

(58) Field of Classification Search
CPC ............ G11C 11/1675; G11C 11/1655; G11C 11/1657; G11C 11/1673
USPC ........................................................ 365/158
See application file for complete search history.

(56) References Cited

U.S. PATENT DOCUMENTS

| | | | | |
|---|---|---|---|---|
| 6,781,874 | B2 * | 8/2004 | Hidaka | G11C 7/18 365/158 |
| 7,764,536 | B2 | 7/2010 | Luo et al. | |
| 9,478,273 | B2 * | 10/2016 | Dray | G11C 11/1675 |
| 9,875,780 | B1 | 1/2018 | DeBrosse | |
| 2009/0262571 | A1 * | 10/2009 | Sakimura | G11C 11/1655 365/158 |
| 2010/0067289 | A1 | 3/2010 | Fuji | |
| 2011/0292743 | A1 | 12/2011 | Zimmerman | |

FOREIGN PATENT DOCUMENTS

| | | |
|---|---|---|
| TW | 201447898 A | 12/2014 |
| TW | 201515007 A | 4/2015 |

OTHER PUBLICATIONS

First Taiwanese Office Action and Search Report for TW Application No. 108113231 dated Oct. 23, 2019, No translation provided, 7 pages.

* cited by examiner

*Primary Examiner* — Vu A Le (57) ABSTRACT

The present disclosure relates to a structure which includes a merged write driver circuit with a first device next to a first memory array and a second device next to a second memory array, and the merged write driver circuit being configured to share a write driver line between the first device and the second device.

19 Claims, 5 Drawing Sheets

MERGED WRITE DRIVER BASED ON LOCAL SOURCE LINE MRAM ARCHITECTURE

FIELD OF THE INVENTION

The present disclosure relates to a merged write driver, and more particularly, to a circuit and a method for a merged write driver based on local source line magnetoresistive random access memory (MRAM) architecture.

BACKGROUND

Magnetoresistive random access memory (MRAM) includes an electrically connected array of magnetoresistive memory elements, referred to as magnetic tunnel junctions (MTJs). Each magnetic tunnel junction includes a free layer and fixed/reference layer that each includes a magnetic material layer. A non-magnetic insulating tunnel barrier separates the free and fixed/reference layers. The free layer and the reference layer are magnetically de-coupled by the tunnel bander. The free layer has a variable magnetization direction, and the reference layer has an invariable magnetization direction.

A magnetic tunnel junction stores information by switching the magnetization state of the free layer. When the magnetization direction of the free layer is parallel to the magnetization direction of the reference layer, the magnetic tunnel junction is in a low resistance state. Conversely, when the magnetization direction of the free layer is antiparallel to the magnetization direction of the reference layer, the magnetic tunnel junction is in a high resistance state. The difference in resistance of the magnetic tunnel junction may be used to indicate a logical '1' or '0', thereby storing a bit of information. The tunnel magnetoresistance (TMR) of a magnetic tunnel junction determines the difference in resistance between the high and low resistance state. A relatively high difference between the high and low resistance states facilitates read operations in the MRAM.

SUMMARY

In an aspect of the disclosure, a structure includes a merged write driver circuit with a first device next to a first memory array and a second device next to a second memory array, and the merged write driver circuit being configured to share a write driver line between the first device and the second device.

In another aspect of the disclosure, a circuit includes a plurality of bit lines, a plurality of reference bit lines, a merged write driver circuit connected to a shared write driver line and which is connected to the plurality of reference bit lines through a plurality of pull ups, a first set of transistors with a drain connected to the plurality of reference bit lines and a source connected to a global source line, a second set of transistors with a drain connected to a word line and a source connected to a common source line, and an unused global mux output in the first set of transistors which is connected to a pull down leg to complete a current loop for performing a write operation of data.

In another aspect of the disclosure, a method includes sharing a write driver line between a first device next to a first memory array and a second device next to a second memory array, and performing a write operation of data with the write driver line being connected to a merged write driver circuit.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a merged write driver, and more particularly, to a circuit and a method for a merged write driver based on a local source line magnetoresistive random access memory (MRAM) architecture. In more specific embodiments, the present disclosure provides a merged write driver. Advantageously, the present disclosure saves silicon area by providing a merged write driver for both a top and bottom array of a MRAM architecture without increasing the parasitic resistance.

In conventional circuitry, a local source line architecture, in which the bit line and the source line are in parallel, makes it possible to use a write driver on a side of a MRAM bit cell array block without sacrificing high parasitic resistance. Further, in the conventional circuitry of a MRAM architecture in which the bit line and the source line are in parallel, pull down and pull up drivers need to be placed on each side of the MRAM bit cell array block for lower parasitic resistance. Otherwise, if both the pull down driver and pull up driver in the conventional circuitry are not placed on each side of the MRAM bit cell array block, the parasitic resistance will be doubled, which negatively impacts MRAM read performance. In addition, in the conventional circuitry, the MRAM architecture places a sense amplifier (SA) and write driver in between the bit cell array blocks to share a same circuit for area efficiency. Due to the local source line architecture of the conventional circuitry, the write driver can be put on each side of both bit cell array blocks (i.e., a top array and a bottom array).

In contrast to the conventional circuitry, the present disclosure reduces the circuit area and provides improved area efficiency by merging the write drivers for both the top array and the bottom array without increasing the parasitic resistance. In embodiments, the present disclosure can provide a merged write driver architecture with either an enhanced area efficiency, better switching current drivability, or both enhanced area efficiency and better switching current drivability. In the circuit described herein, the sense amplifier (SA) and write driver are placed between bit cell array blocks and are shared to increase area efficiency without sacrificing parasitic resistance. Further, the shared write driver can be used to provide enough switching current (with margin) to reduce the write bit error rate (WBER). As should be understood by those of ordinary skill in the art, the size of the pull up device is a large portion of the write driver and impacts the silicon area.

In the present disclosure, by connecting the driving drain/source between the top memory array and the bottom memory area, write driver area efficiency can be substantially improved with the same current drivability. Alternatively, a high current drivability, which leads to better write bit error rate, can be accomplished using the same silicon area. Lastly, a trade off can be made in which improved area efficiency and improved current drivability are accomplished at the same time.

Figure 1:
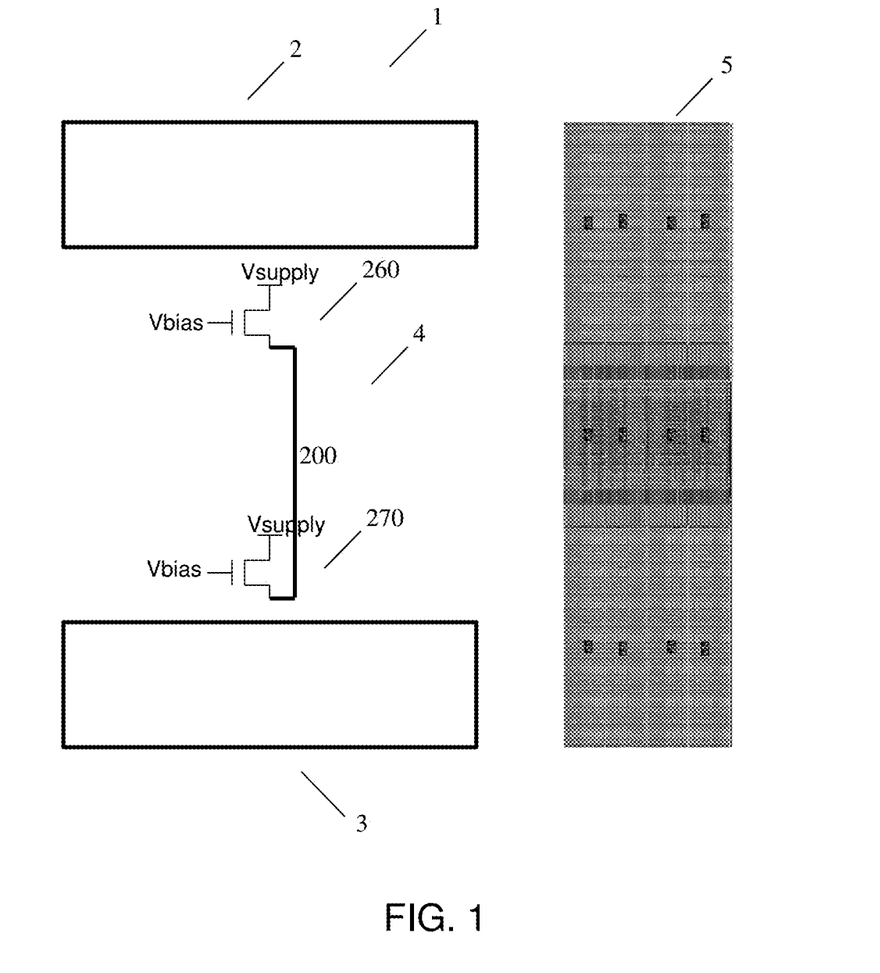
FIG. 1 shows a MRAM architecture with a merged write driver in accordance with aspects of the present disclosure.

FIG. 1 shows a MRAM architecture with a merged write driver architecture in accordance with aspects of the present disclosure. In FIG. 1, the MRAM architecture with a merged write driver architecture 1 includes a top memory array 2, a bottom memory array 3, a merged write driver 4, and a shared write driver line 200. Further, in FIG. 1, a circuit diagram 5 represents an example of a hardware design layout which corresponds with the MRAM architecture with the merged write driver architecture.

In FIG. 1, the merged write driver 4 is between the top memory array 2 and the bottom memory array 3. Further, the merged write driver 4 includes a first NMOS transistor 260 which is positioned near the top memory array 2. The first NMOS transistor 260 has a drain connected to a supply voltage Vsupply, a gate connected to a bias voltage Vbias, and a source connected to the shared write driver line 200. Further, the merged write driver 4 includes a second NMOS transistor 270 which is positioned near the bottom memory array 3. The second NMOS transistor 270 has a drain connected to a supply voltage Vsupply, a gate connected to a bias voltage Vbias, and a source connected to the shared write driver line 200.

In the operation of FIG. 1, the merged write driver 4 includes a write switching current from both the first NMOS transistor 260 and the second NMOS transistor 270. This circuit 1 allows for a better area efficiency with smaller NMOS devices on each side. Alternatively (or in addition), the operation can allow for better switching current (i.e., better write bit error rate, WBER) with both NMOS devices contributing to the switching efforts.

Figure 2:
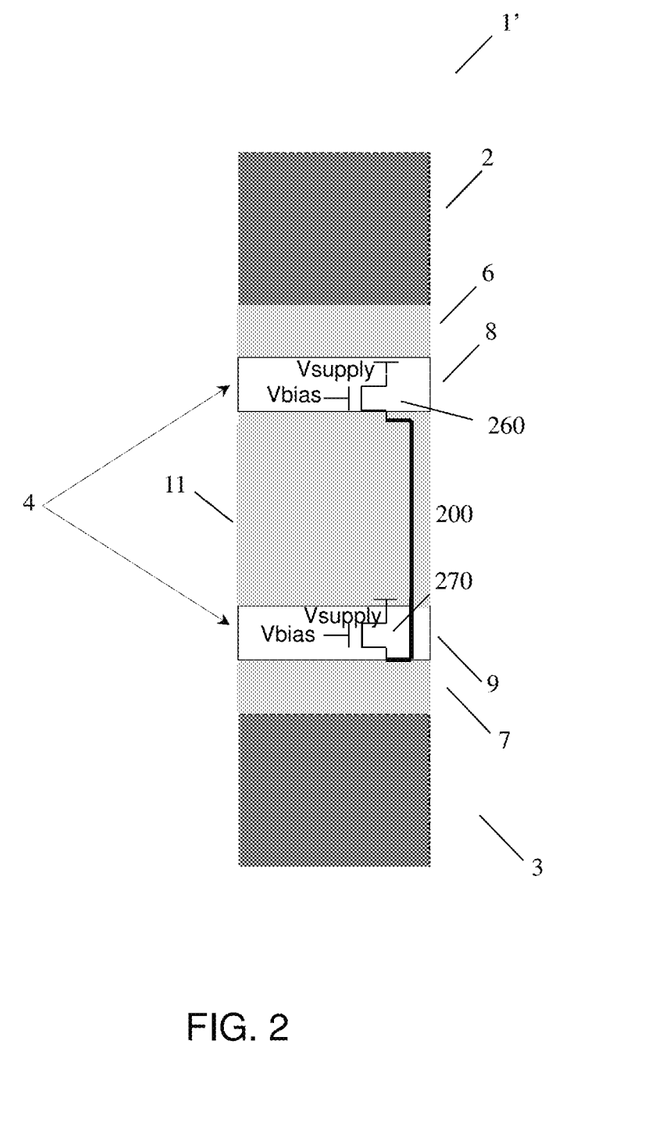
FIG. 2 shows another MRAM architecture with a merged write driver in accordance with aspects of the present disclosure.

FIG. 2 shows another MRAM architecture with a merged write driver architecture in accordance with aspects of the present disclosure. In FIG. 2, the MRAM architecture with a merged write driver architecture 1' includes a top memory array 2, a bottom memory array 3, a merged write driver 4 (as indicated by the arrows), a top bit line multiplexer 6, a bottom bit line multiplexer 7, a sense amplifier 11, and a shared write driver line 200. In FIG. 2, the merged write driver 4 includes a first write driver area 8 and a second write driver area 9. The sense amplifier 11 includes a shift register and a digital mask DMASK logic.

Moreover, similar to FIG. 1, the first NMOS transistor 260 of the merged write driver 4 in FIG. 2 has a drain connected to a supply voltage Vsupply, a gate connected to a bias voltage Vbias, and a source connected to the shared write driver line 200. The second NMOS transistor 270 of the merged write driver 4 has a drain connected to a supply voltage Vsupply, a gate connected to a bias voltage Vbias, and a source connected to the shared write driver line 200.

In contrast to conventional circuitry, a MRAM architecture described herein does not require an additional top write driver and an additional top source line multiplexer near the top memory array 2 and an additional bottom write driver and an additional bottom source line multiplexer near the bottom memory array 3. Therefore, in the present disclosure, embodiments can save area by eliminating the additional top write driver, the additional top source line multiplexer, the additional bottom write driver, and the additional bottom source line multiplexer when using the merged write driver 4 in FIG. 2.

Figure 3:
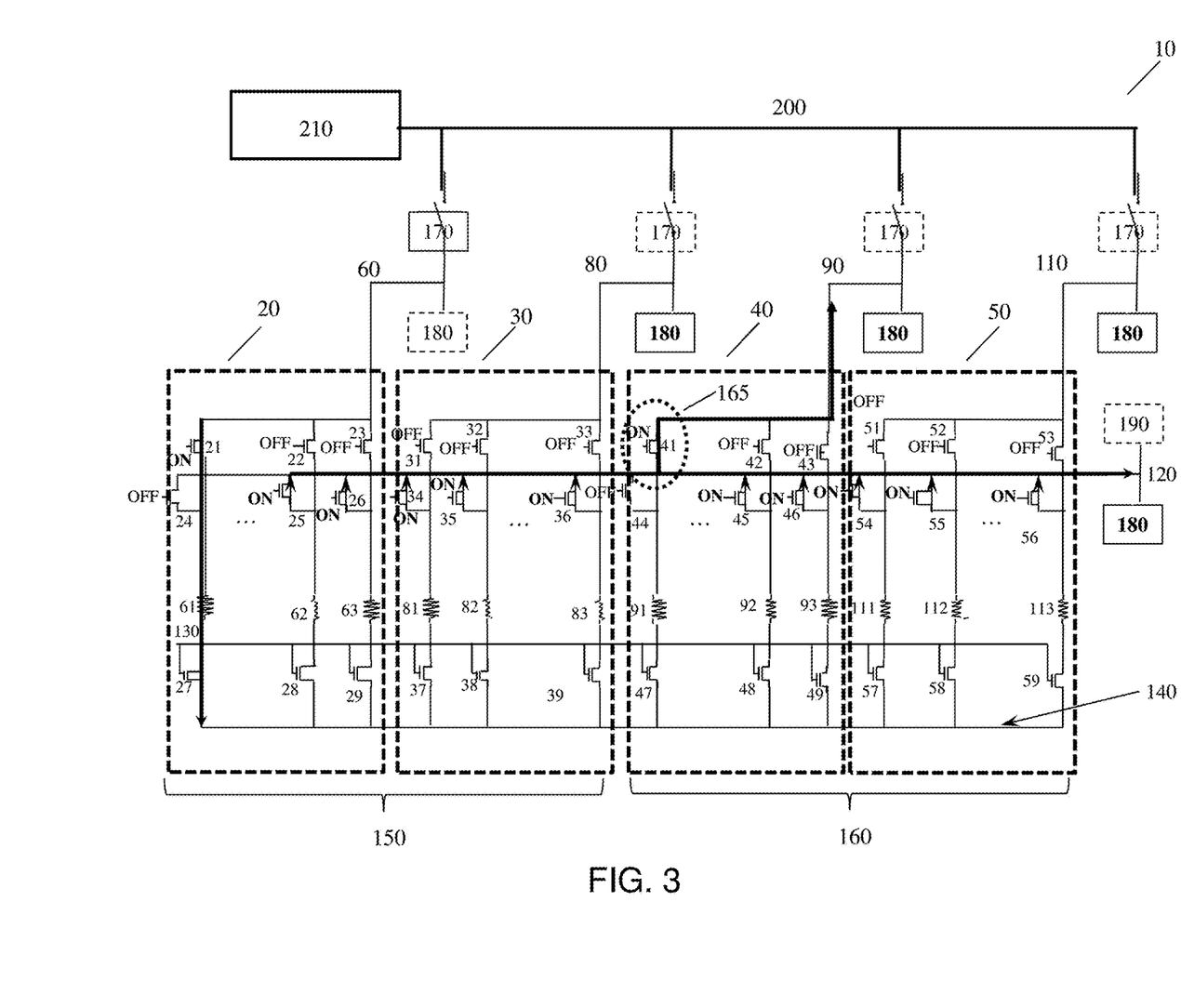
FIG. 3 shows a column multiplexor decoding scheme during a down write operation with a merged write driver in accordance with aspects of the present disclosure.

FIG. 3 shows a column multiplexor decoding scheme during a down write operation with a merged write driver architecture in accordance with aspects of the present disclosure. In FIG. 3, the bit columns of the column mux circuit 10 are divided into four groups: group 20, group 30, group 40, and group 50. Each of the groups 20, 30, 40, and 50 include a corresponding reference column bit line 60, 80, 90, and 110. A left side 150 of the column mux circuit 10 includes 64 bit lines (i.e., 32 bit lines per group) and two reference column bit lines (i.e., reference column bit lines 60, 80). A right side 160 of the column mux circuit 10 includes 64 bit lines (i.e., 32 bit lines per group) and two reference column bit lines (i.e., reference column bit lines 90, 110). FIG. 3 also includes the shared write driver line 200 of FIGS. 1 and 2 and a merged write driver 210 (which is similar to the merged write driver 4 in FIGS. 1 and 2).

In FIG. 3, the group 20 includes NMOS transistors 21, 22, and 23 with their drains connected to a reference column bit line 60 and their sources connected to a global source line 120. The group 20 also includes a NMOS transistor 24 with a drain connected to the global source line 120 and a source connected to a resistor 61. In addition, the group 20 includes a NMOS transistor 25 with its drain connected to the global source line 120 and its source connected to a resistor 62. Also, in group 20, a NMOS transistor 26 has its drain connected to the global source line 120 and its source connected to a resistor 63; whereas NMOS transistors 27, 28, and 29 have their drains connected to a word line 130 and their sources connected to a common source line 140.

In FIG. 3, the group 30 includes NMOS transistors 31, 32, and 33 with their drains connected to a reference column bit line 80 and their sources connected to a global source line 120. The group 30 also includes a NMOS transistor 34 with its drain connected to the global source line 120 and its source connected to a resistor 81. In addition, the group 30 includes a NMOS transistor 35 with its drain connected to the global source line 120 and its source connected to a resistor 82. Also, in group 30, a NMOS transistor 36 has a drain connected to the global source line 120 and a source connected to a resistor 83; whereas NMOS transistors 37, 38, and 39 have their drains connected to a word line 130 and their sources connected to a common source line 140.

In FIG. 3, the group 40 includes NMOS transistors 41, 42, and 43 with their drains connected to a reference column bit line 90 and their sources connected to a global source line 120. The group 40 also includes a NMOS transistor 44 with its drain connected to the global source line 120 and its source connected to the resistor 91. In addition, the group 40 includes a NMOS transistor 45 with a drain connected to the global source line 120 and a source connected to the resistor 92. Also, in the group 40, a NMOS transistor 46 has its drain connected to the global source line 120 and its source connected to the resistor 93; whereas NMOS transistors 47, 48, and 49 have their drains connected to a word line 130 and their sources connected to a common source line 140.

In FIG. 3, the group 50 includes NMOS transistors 51, 52, and 53 with their drains connected to a reference column bit line 110 and their sources connected to a global source line 120. The group 50 also includes a NMOS transistor 54 with its drain connected to the global source line 120 and its source connected to a resistor 111. In addition, the group 50 includes a NMOS transistor 55 with its drain connected to the global source line 120 and its source connected to a resistor 112. Also, in the group 50, a NMOS transistor 56 has its drain connected to the global source line 120 and its source connected to a resistor 113; whereas NMOS transistors 57, 58, and 59 have their drains connected to a word line 130 and their sources connected to a common source line 140.

The column mux circuit 10 includes a pull up 170 with a pull down voltage level (i.e., VPND), a pull down leg 180, a pull up 190 with a pull up voltage level (i.e., VPNU), and another unused global mux output 165. Further, the column mux circuit 10 also includes the shared write driver line 200 and a merged write driver 210.

In a down write operation of FIG. 3, the unused global mux output 165 (i.e., selected but not used column) is hooked up to the pull down leg 180. Therefore, the unused global mux output 165 will act like one of the many pull down current branches which are in parallel from the common source line 140 to the pull down leg 180 on the global source line 120. In FIG. 3, the column mux circuit 10 has a digital mask DMASK logic which is updated to add the pull down leg 180 on a selected but not used column (i.e., unused global mux output 165).

In the down write operation of FIG. 3, NMOS transistors 22, 23, 24, 31, 32, 33, 42, 43, 44, 51, 52, and 53 are OFF and NMOS transistors 21, 25, 26, 27, 28, 29, 34, 35, 36, 37, 38, 39, 41, 45, 46, 47, 48, 49, 54, 55, 56, 57, 58, and 59 are ON. Further, as shown in the down write operation of FIG. 3, current flow occurs from transistor 21 to transistor 27. Further, in FIG. 3, current flow occurs through transistors 25, 26, 34, 35, 36, 41, 45, 46, 54, 55, and 56. In addition, the pull down leg 180 provides a pull down to ground for the transistor 41 to complete a current loop for the down write operation. The shared write driver line 200 and the merged write driver 210 in FIG. 3 provides a pull down to ground using the pull down leg 180.

Figure 4:
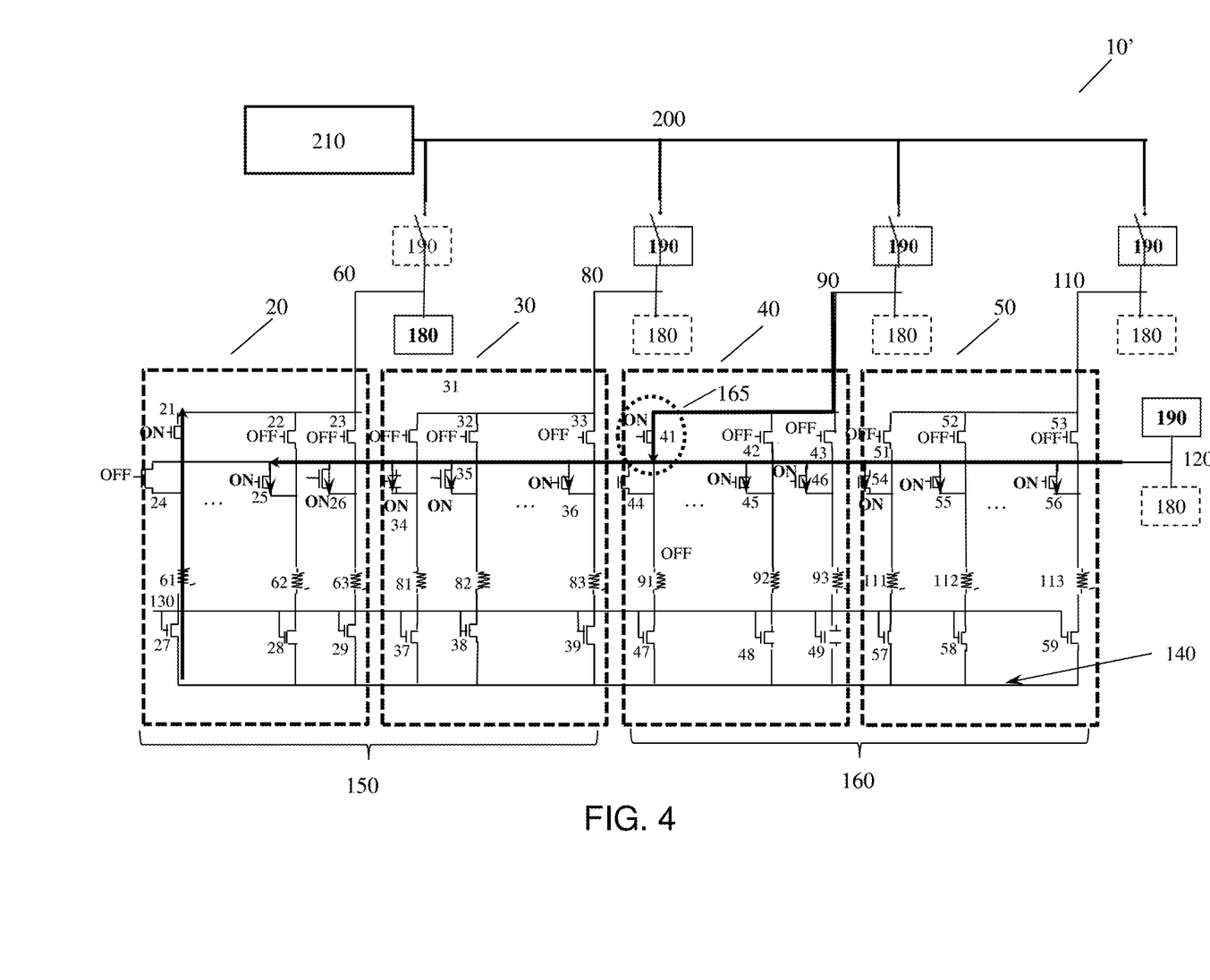
FIG. 4 shows a column multiplexor decoding scheme during an up write operation with a merged write driver in accordance with aspects of the present disclosure.

FIG. 4 shows a column multiplexor decoding scheme during an up write operation with a merged write driver architecture in accordance with aspects of the present disclosure. FIG. 4 is similar to FIG. 3 except that the column mux circuit 10' includes a pull down leg 180, a pull up 190 with a pull up voltage level (i.e., VPNU), and another unused global mux output 165. Further, the column mux circuit 10' also includes the shared write driver line 200 of FIGS. 1 and 2 and the merged write driver 210 (which is similar to the merged write driver 4 in FIGS. 1 and 2).

In an up write operation of FIG. 4, the unused global mux output 165 (i.e., selected but not used column) is hooked up to a pull up 190 leg. In addition, the pull up level follows the pull up voltage level (i.e., VPNU) for the up write operation to avoid leakage current between VPNU and VPND. Therefore, the unused global mux output 165 will act like one of the many pull up current branches in parallel from the pull up 190 leg on the global source line 120 to the common source line 140. In FIG. 4, the column mux circuit 10' has a digital mask DMASK logic which is updated to add an extra pull up 190 leg with a pull up voltage level (i.e., VPNU) on a selected but not used column (i.e., unused global mux output 165).

In the up write operation of FIG. 4, NMOS transistors 22, 23, 24, 31, 32, 33, 42, 43, 44, 51, 52, and 53 are OFF and NMOS transistors 21, 25, 26, 27, 28, 29, 34, 35, 36, 37, 38, 39, 41, 45, 46, 47, 48, 49, 54, 55, 56, 57, 58, and 59 are ON. Further, as shown in the up write operation of FIG. 4, upward current flow occurs from transistor 27 to transistor 21. Further, in FIG. 4, downward current flow occurs through transistors 25, 26, 34, 35, 36, 41, 45, 46, 54, 55, and 56. In addition, the transistor 41 connects to a pull up 190 leg so that current flows from a power supply to group 40 and then is combined with the global source line 120 to provide power to a targeted device for a pull up current on the up write operation. The shared write driver line 200 and the merged write driver 210 in FIG. 4 provides current to a bit cell device using the pull-up leg 190.

Figure 5:
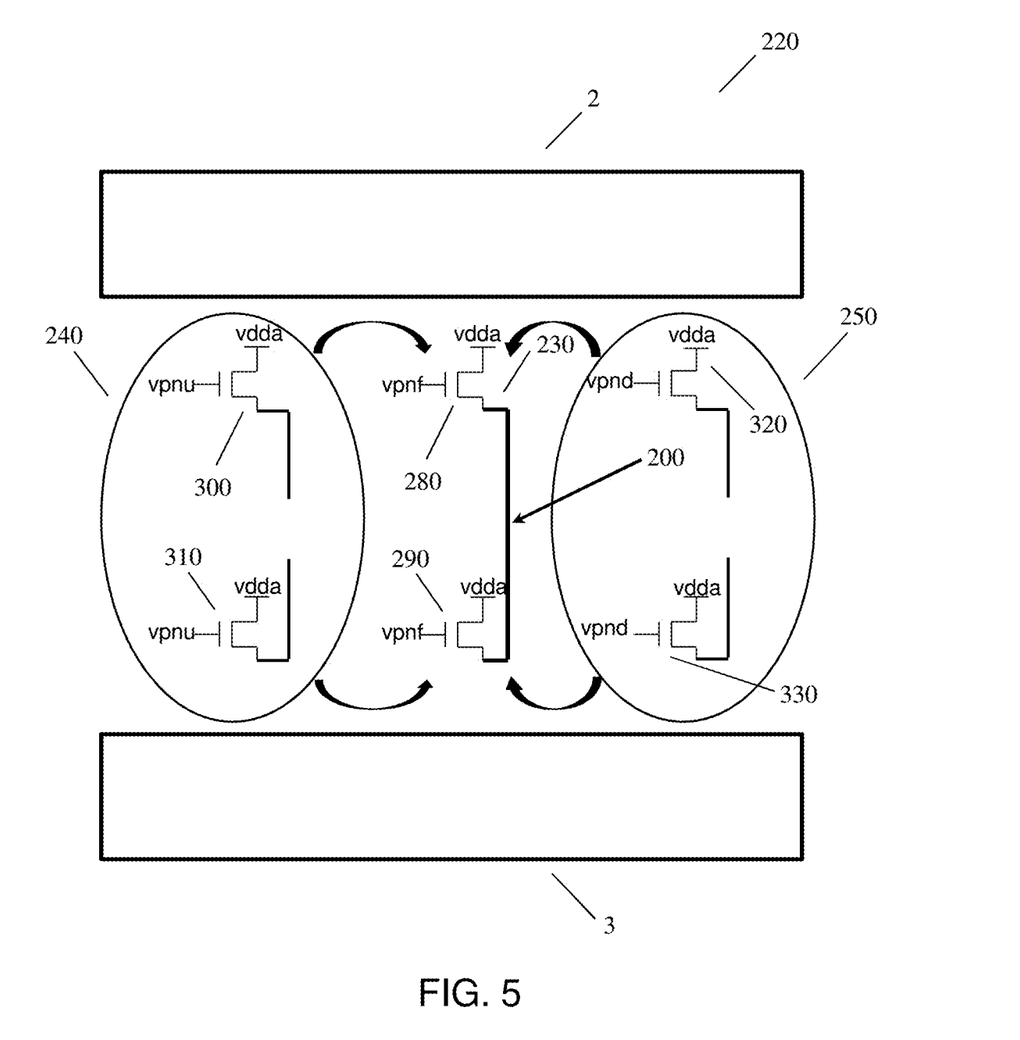
FIG. 5 shows another MRAM architecture with a merged write driver architecture in accordance with aspects of the present disclosure.

FIG. 5 shows another MRAM architecture with a merged write driver architecture in accordance with aspects of the present disclosure. In FIG. 5, the MRAM architecture with a merged write driver 220 includes the top memory array 2, the bottom memory array 3, a merged write driver 230, and a shared write driver line 200. In FIG. 5, the merged write driver 230 merges a first write driver 240 and a second write driver 250.

In FIG. 5, the first write driver 240 includes a first NMOS transistor 300 with a drain connected to a voltage supply level vdda and a gate connected to a pull up voltage level VPNU and a second NMOS transistor 310 with a drain connected to the voltage supply level vdda and a gate connected to a pull up voltage level VPNU. Further, in the first write driver 240, the first NMOS 300 transistor has a source line which is not connected with a source line of the second NMOS transistor 310. The second write driver 250 includes a first NMOS transistor 320 with a drain connected to a voltage supply level vdda and a gate connected to a pull down voltage level VPND and a second NMOS transistor 330 with a drain connected to the voltage supply level vdda and a gate connected to a pull down voltage level VPND. Further, in the second write driver 250, the first NMOS transistor 320 has a source line which is not connected with a source line of the second NMOS transistor 330.

In FIG. 5, the merged write driver 230, which merges the first write driver 240 and the second write driver 250, has a first NMOS transistor 280 and a second NMOS transistor 290. Further, the first NMOS transistor 280 of the merged write driver 230 has a drain connected to the voltage supply level vdda, a gate connected to a voltage pull n-follower VPNF, and a source connected to the shared write driver line 200. The second NMOS transistor 290 of the merged write driver 230 has a drain connected to the voltage supply level vdda, a gate connected to the voltage pull n-follower VPNF, and a source connected to the shared write driver line 200.

In FIG. 5, the pull up voltage level VPNU and the pull down voltage level VPND will merge into the voltage pull n-follower VPNF for both the top memory array 2 and the bottom memory array 3. Further, the voltage pull n-follower VPNF will be the pull up voltage level VPNU during a write (or erase) operation and will be the pull down voltage level VPND during a down write (or program) operation.

In FIG. 5, the MRAM architecture with the merged write driver 230 can have an approximately 2% area saving over the conventional circuitry of the MRAM architecture which includes a separate write driver for each of the top memory array and the bottom memory array. Further, in the present disclosure, a better area efficiency can occur with smaller NMOS devices on each side of the merged write driver 230. Alternatively (or in addition), a better switching current (i.e., better write bit error rate) can occur with both NMOS devices on each side of the merged write driver 230 contributing to the switching efforts.

The circuit and the method for a merged write driver based on local source line magnetoresistive random access memory (MRAM) architecture of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a merged write driver based on local source line magnetoresistive random access memory (MRAM) architecture of the present disclosure has been adopted from integrated circuit (IC) technology. For example, the structures are built on wafers and are realized in films of material patterned by photolithographic processes on the top of a wafer. In particular, the fabrication of the circuit and the method a merged write driver based on local source line magnetoresistive random access memory (MRAM) architecture uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a merged write driver circuit with a first device next to a first memory array and a second device next to a second memory array, wherein the merged write driver circuit is configured to share a write driver line between the first device and the second device, wherein the first device and the second device are each a NMOS transistor;
    a plurality of reference bit lines connected to the merged write driver circuit through a plurality of pull ups;
    a first set of transistors with a drain connected to the plurality of reference bit lines and a source connected to a global source line;
    a second set of transistors with a drain connected to a word line and a source connected to a common source line; and
    an unused global mux output of the first set of transistors which is connected to a pull down leg to complete a current loop for performing a write operation of data.

2. The structure of claim 1, wherein the first device comprises a source which is connected to the write driver line.

3. The structure of claim 2, wherein the second device comprises a source which is connected to the write driver line.

4. The structure of claim 1, wherein the first memory array and the second memory array are part of a magnetoresistive random access memory (MRAM).

5. The structure of claim 1, wherein the write driver line shared between the first device and the second device provides a current driving capability using a same predetermined area.

6. The structure of claim 1, wherein the write driver line being shared between the first device and the second device provides an area efficiency with a same predetermined current driving capability.

7. The structure of claim 1, wherein the merged write driver circuit and the write driver line being shared between the first device and the second device provide a write operation of data.

8. The structure of claim 7, wherein the write operation of the data comprises a down write operation of the data.

9. The structure of claim 7, wherein the write operation of the data comprises an up write operation of the data.

10. A circuit, comprising:
    a plurality of bit lines;
    a plurality of reference bit lines;
    a merged write driver circuit connected to a shared write driver line and which is connected to the plurality of reference bit lines through a plurality of pull ups;
    a first set of transistors with a drain connected to the plurality of reference bit lines and a source connected to a global source line;
    a second set of transistors with a drain connected to a word line and a source connected to a common source line; and
    an unused global mux output in the first set of transistors which is connected to a pull down leg to complete a current loop for performing a write operation of data.

11. The circuit of claim 10, wherein the unused global mux output is connected to the pull down leg to enable a pull down to ground.

12. The circuit of claim 10, wherein the first set of transistors comprises NMOS transistors.

13. The circuit of claim 12, wherein the second set of transistors comprises NMOS transistors.

14. The circuit of claim 13, wherein the plurality of reference bit lines comprises a reference data bit line receiving the data.

15. The circuit of claim 14, wherein the write operation of the data is a down write operation of the data.

16. A method, comprising:
    sharing a write driver line between a first device comprising a first NMOS transistor next to a first memory array and a second device comprising a second NMOS transistor next to a second memory array; and
    performing a write operation of data with the shared write driver line being connected to a merged write driver circuit which includes the first device and the second device,
    wherein
        a plurality of reference bit lines are connected to the merged write driver circuit through a plurality of pull ups;

a first set of transistors includes a drain connected to the plurality of reference bit lines and a source connected to a global source line;

a second set of transistors includes a drain connected to a word line and a source connected to a common source line; and an unused global mux output of the first set of transistors is connected to a pull down leg to complete a current loop for performing a write operation of data.

17. The method of claim 16, wherein the performing the write operation of the data further comprises performing a down write operation of the data.

18. The method of claim 16, wherein the performing the write operation of the data further comprises performing an up write operation of the data.

19. The method of claim 16, wherein the first memory array and the second memory array are part of a magnetoresistive random access memory (MRAM).

\* \* \* \* \*